United States Patent
Lieber et al.

(10) Patent No.: US 10,049,871 B2
(45) Date of Patent: Aug. 14, 2018

(54) ANISOTROPIC DEPOSITION IN NANOSCALE WIRES

(71) Applicant: President and Fellows of Harvard College, Cambridge, MA (US)

(72) Inventors: Charles M. Lieber, Lexington, MA (US); Sun-Kyung Kim, Yong In Si (KR); Robert Day, Somerville, MA (US); Hong-Gyu Park, Seoul (KR); Thomas J. Kempa, Somerville, MA (US)

(73) Assignees: President and Fellows of Harvard College, Cambridge, MA (US); Korea University, Seoul (KP)

( * ) Notice: Subject to any disclaimer, the term of this patent is extended or adjusted under 35 U.S.C. 154(b) by 329 days.

(21) Appl. No.: 14/766,285

(22) PCT Filed: Feb. 4, 2014

(86) PCT No.: PCT/US2014/014596
§ 371 (c)(1),
(2) Date: Aug. 6, 2015

(87) PCT Pub. No.: WO2014/123860
PCT Pub. Date: Aug. 14, 2014

(65) Prior Publication Data
US 2015/0380244 A1 Dec. 31, 2015

Related U.S. Application Data

(60) Provisional application No. 61/761,384, filed on Feb. 6, 2013.

(51) Int. Cl.
*H01L 21/02* (2006.01)
*C30B 25/18* (2006.01)
(Continued)

(52) U.S. Cl.
CPC ........ *H01L 21/02603* (2013.01); *C30B 25/04* (2013.01); *C30B 25/18* (2013.01);
(Continued)

(58) Field of Classification Search
CPC ....... H01L 21/02603; H01L 121/02603; H01L 121/024433; H01L 21/02532;
(Continued)

(56) References Cited

U.S. PATENT DOCUMENTS

2002/0175408 A1    11/2002    Majumdar et al.
2006/0188774 A1*    8/2006    Niu .................... H01M 4/8605
                                                    429/409
(Continued)

FOREIGN PATENT DOCUMENTS

WO    WO 02/017362 A2    2/2002
WO    WO 02/048701 A2    6/2002
(Continued)

OTHER PUBLICATIONS

International Search Report and Written Opinion for Application No. PCT/US2014/014596 dated Nov. 19, 2014.
(Continued)

*Primary Examiner* — John E Uselding
(74) *Attorney, Agent, or Firm* — Wolf, Greenfield & Sacks, P.C.

(57) ABSTRACT

The present invention generally relates to nanoscale wires, including anisotropic deposition in nanoscale wires. In one set of embodiments, material may be deposited on certain portions of a nanoscale wire, e.g., anisotropically. For example, material may be deposited on a first facet of a crystalline nanoscale wire but not on a second facet. In some cases, additional materials may be deposited thereon, and/or the portions of the nanoscale wire may be removed, e.g., to produce vacant regions within the nanoscale wire, which
(Continued)

may contain gas or other species. Other embodiments of the invention may be directed to articles made thereby, devices containing such nanoscale wires, kits involving such nanoscale wires, or the like.

16 Claims, 10 Drawing Sheets

(51) Int. Cl.
```
C30B 29/60      (2006.01)
C30B 25/04      (2006.01)
C30B 29/06      (2006.01)
C30B 29/08      (2006.01)
H01L 21/306     (2006.01)
H01L 29/06      (2006.01)
H01L 29/16      (2006.01)
```
(52) U.S. Cl.
CPC .............. *C30B 29/06* (2013.01); *C30B 29/08* (2013.01); *C30B 29/602* (2013.01); *H01L 21/0262* (2013.01); *H01L 21/02433* (2013.01); *H01L 21/02532* (2013.01); *H01L 21/30604* (2013.01); *H01L 29/0669* (2013.01); *H01L 29/16* (2013.01)

(58) Field of Classification Search
CPC ... H01L 121/0262; C30B 25/04; C30B 25/18; C30B 29/06; C30B 29/602
See application file for complete search history.

(56) References Cited

U.S. PATENT DOCUMENTS

| | | | |
|---|---|---|---|
| 2007/0051942 A1 | 3/2007 | Brown et al. | |
| 2007/0086916 A1 | 4/2007 | LeBoeuf et al. | |
| 2008/0266556 A1 | 10/2008 | Kamins et al. | |
| 2009/0095950 A1* | 4/2009 | Lieber | B82Y 10/00 |
| | | | 257/4 |
| 2009/0242869 A1 | 10/2009 | Hovel et al. | |
| 2009/0289244 A1 | 11/2009 | Pryor et al. | |
| 2009/0289245 A1 | 11/2009 | Jin et al. | |
| 2010/0075145 A1 | 3/2010 | Joo et al. | |
| 2010/0148149 A1 | 6/2010 | Quanano et al. | |
| 2010/0190005 A1 | 7/2010 | Nair et al. | |
| 2010/0252813 A1 | 10/2010 | Crowder et al. | |
| 2011/0042641 A1 | 2/2011 | Lieber et al. | |
| 2011/0175059 A1 | 7/2011 | Kahen et al. | |
| 2012/0006390 A1 | 1/2012 | Huo et al. | |
| 2012/0177319 A1 | 7/2012 | Alemohammad et al. | |
| 2017/0073841 A1 | 3/2017 | Lieber et al. | |
| 2017/0117147 A1 | 4/2017 | Lieber et al. | |

FOREIGN PATENT DOCUMENTS

| | | | |
|---|---|---|---|
| WO | WO-02080280 A1 * | 10/2002 | ............ B82Y 10/00 |
| WO | WO 04/038767 A2 | 5/2004 | |

OTHER PUBLICATIONS

International Preliminary Report on Patentability for Application No. PCT/US2014/014596 dated Aug. 20, 2015.
Invitation to Pay Additional Fees for Application No. PCT/US2015/029373 dated Jul. 21, 2015.
International Search Report and Written Opinion for Application No. PCT/US2015/029373 dated Sep. 30, 2015.
Invitation to Pay Additional Fees for Application No. PCT/US2015/035317 dated Sep. 2, 2015.
International Preliminary Report on Patentability for Application No. PCT/US2015/029373 dated Nov. 17, 2016.
International Search Report and Written Opinion for Application No. PCT/US2015/035317 dated Nov. 24, 2015.
International Preliminary Report on Patentability dated Dec. 22, 2016 for Application No. PCT/US2015/035317.
Kempa et al., Facet-selective growth on nanowires yields multi-component nanostructures and photonic devices. J Am Chem Soc. Dec. 11, 2013;135(49):18354-7. doi: 10.1021/ja411050r. Epub Dec. 2, 2013.

* cited by examiner

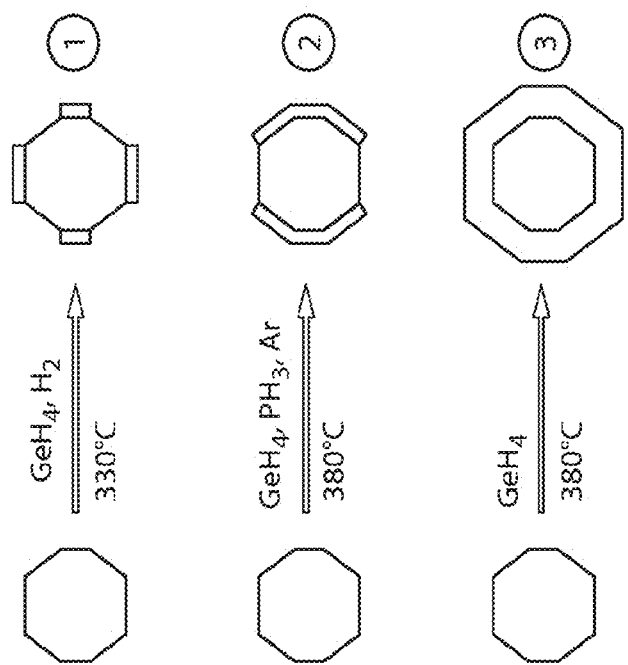
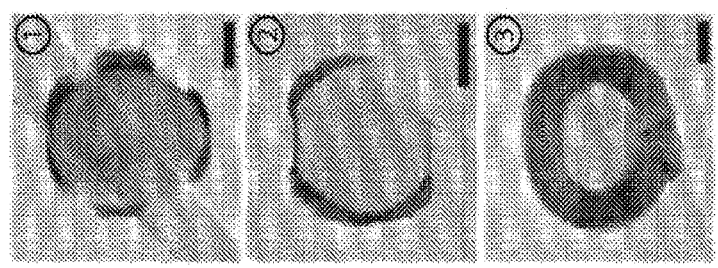
Fig. 2A
Fig. 2B

US 10,049,871 B2

ANISOTROPIC DEPOSITION IN NANOSCALE WIRES

RELATED APPLICATIONS

This application is a national stage of Int. Patent Application Serial No. PCT/US2014/014596, filed Feb. 4, 2014, entitled "Anisotropic Deposition in Nanoscale Wires," by Lieber, et al., which claims the benefit of U.S. Provisional Patent Application Ser. No. 61/761,384, filed Feb. 6, 2013, entitled "Anisotropic Deposition in Nanoscale Wires," by Lieber, et al., each incorporated herein by reference in its entirety.

This invention was made with government support under Grant No. N00244-09-1-0078 awarded by the Department of Defense. The government has certain rights in the invention.

FIELD

The present invention generally relates to nanoscale wires, including anisotropic deposition in nanoscale wires.

BACKGROUND

Interest in nanotechnology, in particular sub-microelectronic technologies such as semiconductor quantum dots and nanowires, has been motivated by the challenges of chemistry and physics at the nanoscale, and by the prospect of utilizing these structures in electronic and related devices. Nanoscopic articles might be well-suited for transport of charge carriers and excitons (e.g. electrons, electron pairs, etc.) and thus may be useful as building blocks in nanoscale electronics applications.

SUMMARY

The present invention generally relates to nanoscale wires, including anisotropic deposition in nanoscale wires. The subject matter of the present invention involves, in some cases, interrelated products, alternative solutions to a particular problem, and/or a plurality of different uses of one or more systems and/or articles.

In one aspect, the present invention is generally directed to a method comprising depositing material on a faceted nanoscale wire. In some embodiments, the material is deposited preferentially on a first facet relative to a second facet of the nanoscale wire.

The present invention, in another aspect, is generally directed to a composition. According to one set of embodiments, the composition comprises a nanoscale wire comprising a first, crystalline material comprising at least a first facet and a second facet, and a second material positioned substantially on the first facet but not the second facet.

In another set of embodiments, the composition comprises a crystalline nanoscale wire comprising a core and at least two separate shell regions surrounding portions of the core.

The composition, in yet another set of embodiments, is generally directed to a semiconductor nanoscale wire comprising a core and a shell surrounding the core. In some cases, the core and the shell are constructed and arranged to define one or more regions therebetween that contain a species.

In another aspect, the present invention encompasses methods of making one or more of the embodiments described herein, for example, nanoscale wires. In still another aspect, the present invention encompasses methods of using one or more of the embodiments described herein, for example, nanoscale wires.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIGS. 2A-2B illustrate anisotropic growth using gas-phase synthesis, in another set of embodiments;

DETAILED DESCRIPTION

Figure 1A:
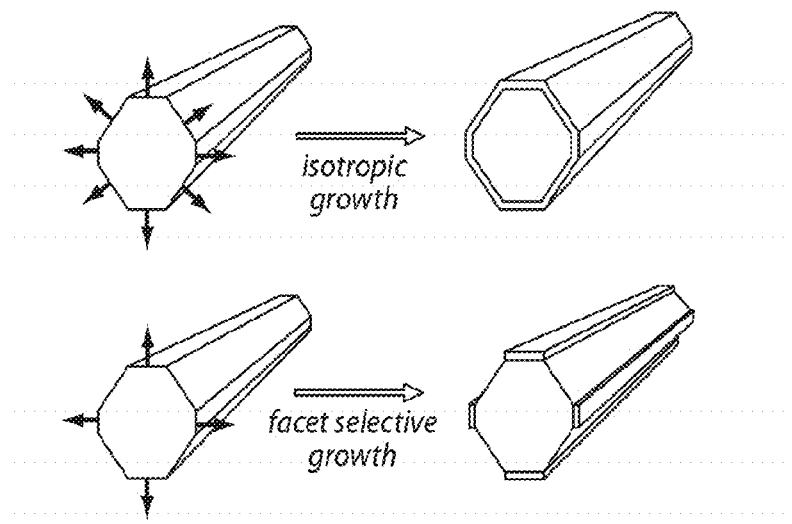
FIGS. 1A-1D illustrate facet-selective growth in accordance with certain embodiments of the invention.

The present invention generally relates to nanoscale wires, including anisotropic deposition in nanoscale wires. In one set of embodiments, material may be deposited on certain portions of a nanoscale wire, e.g., anisotropically. For example, material may be deposited on a first facet of a crystalline nanoscale wire but not on a second facet. In some cases, additional materials may be deposited thereon, and/or the portions of the nanoscale wire may be removed, e.g., to produce vacant regions within the nanoscale wire, which may contain gas or other species. Other embodiments of the invention may be directed to articles made thereby, devices containing such nanoscale wires, kits involving such nanoscale wires, or the like.

One aspect of the present invention is generally directed to systems and methods for depositing material on a nanoscale wire, for example, a semiconductor nanoscale wire, e.g., comprising silicon, germanium, or the like. In some cases, the material is deposited anisotropcially. For example, the material may be preferentially deposited on a first surface of the nanoscale wire, relative to a second surface of the nanoscale wire. In some embodiments, as discussed below, additional materials may be deposited thereon, and/or at least a portion of the deposited material may be etched away or otherwise removed, e.g., leaving behind a vacant region that can subsequently be filled with another species (or just left vacant).

In one set of embodiments, the nanoscale wire, or at least a portion thereof, may be crystalline, e.g., having a regularly ordered arrangement of atoms. The nanoscale wire may be straight or bent, and in some cases, may contain more than one region, e.g., a core and a shell surrounding at least the portion of the core. In some cases, the nanoscale may be formed from a single crystal, for example, a single crystal nanoscale wire comprising a semiconductor. While such a single crystal item may include defects in the crystal in some cases, the single crystal item is distinguished from an item that includes one or more crystals, not ionically or covalently bonded, but merely in close proximity to one another. In other embodiments, however, the nanoscale wire may comprise more than one crystal.

In certain embodiments, the nanoscale wire may include at least one exposed portion that is crystalline. Typically, a crystalline material comprises a number of surfaces or facets that define the outer boundaries of the crystalline material, e.g., that are exposed to air or another material (e.g., another material deposited thereon). As a non-limiting example, silicon is typically exposed on the {111}, {011}, and {113} facets.

Accordingly, in certain embodiments of the invention, material may be preferentially deposited on a faceted nanoscale wire, where the material is deposited preferentially on a first facet relative to a second facet of the nanoscale wire. For instance, in a silicon nanoscale wire comprising {111}, {011}, and {113} facets, a deposited material (for example, another semiconductor material such as silicon or germanium) may be preferentially deposited on the {011} facet relative to the {113} facet, or on the {113} facet relative to the {011} facet, or on the {111} facet relative to the {113} facet, or on the {113} facet relative to the {111} facet, etc. In some cases, material may be deposited onto the first facet while substantially no (or at least undetectable amounts of) material is deposited onto the second facet. In other embodiments, some material may be deposited onto the second facet, but substantially less than the first facet. For instance, the second facet may have a thickness of deposited material that is less than about 50%, less than about 40%, less than about 30%, less than about 20%, or less than about 10% of the thickness of the deposited material on the first facet.

The deposited material may be any material that can be deposited on the nanoscale wire. For example, in one set of embodiments, the deposited material may be a semiconductor material, such as silicon or germanium. In some cases, the deposited material, prior to deposition, is exposed to the nanoscale wire as a gas, e.g., $GeH_4$ in the case of germanium. The deposited material may also have the same composition, or a different composition, than the nanoscale wire. For instance, in one embodiment, silicon may be deposited onto silicon. In some cases, the two materials may also have the same crystal structure. In some cases, the deposited material is also crystalline after deposition.

In one set of embodiments, preferential deposition of the material on the nanoscale wire may be controlled via use of a passivating agent. The passivating agent may preferentially react to one surface or facet of the nanoscale wire, relative to a different surface or facet of the nanoscale wire. For example, the passivating agent may be a gas that is able to absorb onto one surface or facet of the nanoscale wire, and reduce or prevent deposition of a material thereon. As a specific example, a gas such as $PH_3$ may preferentially adsorb onto the {111} surface of a silicon surface, relative to the surface, and such adsorption may reduce or prevent deposition from occurring on the {111} surfaces. In other embodiments, the passivating agent may chemically react with the surface or facet of the nanoscale wire.

In another set of embodiments, preferential deposition of the material on the nanoscale wire may be controlled via use of an agent that enhances deposition of a material. For example, an inert gas such as argon may enhance deposition on the {113} surface of silicon, versus the {111} surface. In some cases, more than one technique may be used, e.g., a passivating agent and an agent that enhances deposition.

In certain aspects, additional materials may be deposited onto the nanoscale wire and/or the deposited material. The additional materials may be deposited using any suitable technique, and may be deposited isotropically or anisotropically. In some embodiments, for example, additional materials may be deposited using the techniques discussed herein. For example, a first material may be preferentially deposited on a first surface, and a second material may be preferentially deposited on a second surface of a nanoscale wire, or on the first material, etc.

In addition, in some cases, a portion of a nanoscale wire formed as discussed herein may be etched or otherwise removed, e.g., after formation. In some embodiments, for instance, the deposited material may be removed, or a portion of the nanoscale wire (e.g., prior to or after addition of the deposited material) may be removed. Those of ordinary skill in the art will be aware of suitable etchants and other techniques for removing material from a nanoscale wire. Examples of etchants that may be used include, but are not limited to e.g., a peroxide such as $H_2O_2$, KOH, $I_2$/KI, ethylene diamine and pyrocatechol, iron chloride, plasmas such as $CCl_4$ or $CF_4$ plasma, tetramethylammonium hydroxide, or the like.

Figure 4A:
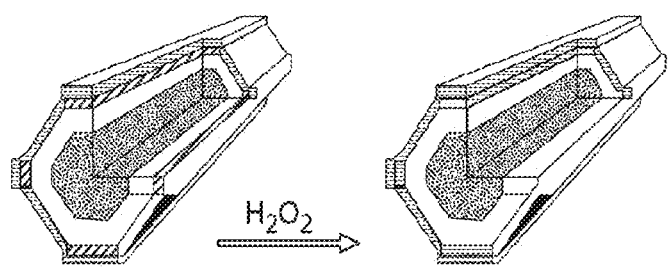
FIGS. 4A-4C illustrate certain nanoscale wires containing vacant regions or gold nanoparticles, in yet other embodiments of the invention.

In some cases, removal of the deposited material may be used to produce vacant regions within the nanoscale wire. As a non-limiting example, as is shown in FIG. 4A, a material such as germanium, anisotropically deposited as discussed herein, may be removed without removing other portions of the material surrounding the germanium. For example, this can be used to produce a core and a shell surrounding the core, with a vacant region between the core and the shell.

In some embodiments, the core and the shell may be physically contacting each other in other locations. For instance, if germanium was deposited only on certain facets of a silicon nanoscale wire, then upon removal of the germanium, only "pockets" of material between the core and the shell may be removed, leaving the core and the shell in physical contact with each other in other locations.

The vacant regions may contain air (or other surrounding gases), and/or a species may be delivered into some or all of the vacant regions. For example, species such as particles (e.g., nanoparticles, such as gold or silver nanoparticles), quantum dots, dyes, fluorescent species, biochemical species such as nucleic acids such as RNA and DNA, proteins, peptides, enzymes, or the like may be delivered into some or all of the vacant regions. In one set of embodiments, the nanoscale wire may be exposed to such a species, which is allowed to enter the vacant regions via diffusion or similar mechanisms.

As mentioned, any nanoscale wire can be used in any of the embodiments discussed herein. Non-limiting examples of suitable nanoscale wires include carbon nanotubes, nanorods, nanowires, organic and inorganic conductive and semiconducting polymers, metal nanoscale wires, semiconductor nanoscale wires (for example, formed from silicon), and the like. Other conductive or semiconducting elements that may not be nanoscale wires, but are of various small nanoscopic-scale dimension, also can be used in certain embodiments.

In general, a "nanoscale wire" (also known herein as a "nanoscopic-scale wire" or "nanoscopic wire") generally is a wire or other nanoscale object, that at any point along its length, has at least one cross-sectional dimension and, in some embodiments, two orthogonal cross-sectional dimensions (e.g., a diameter) of less than 1 micrometer, less than about 500 nm, less than about 200 nm, less than about 150 nm, less than about 100 nm, less than about 70, less than about 50 nm, less than about 20 nm, less than about 10 nm, less than about 5 nm, than about 2 nm, or less than about 1 nm. In some embodiments, the nanoscale wire is generally cylindrical. In other embodiments, however, other shapes are possible; for example, the nanoscale wire can be faceted, i.e., the nanoscale wire may have a polygonal cross-section. The cross-section of a nanoscale wire can be of any arbitrary shape, including, but not limited to, circular, square, rectangular, annular, polygonal, or elliptical, and may be a regular or an irregular shape. The nanoscale wire can also be solid or hollow.

In some cases, the nanoscale wire has one dimension that is substantially longer than the other dimensions of the nanoscale wire. For example, the nanoscale wire may have a longest dimension that is at least about 1 micrometer, at least about 3 micrometers, at least about 5 micrometers, or at least about 10 micrometers or about 20 micrometers in length, and/or the nanoscale wire may have an aspect ratio (longest dimension to shortest orthogonal dimension) of greater than about 2:1, greater than about 3:1, greater than about 4:1, greater than about 5:1, greater than about 10:1, greater than about 25:1, greater than about 50:1, greater than about 75:1, greater than about 100:1, greater than about 150:1, greater than about 250:1, greater than about 500:1, greater than about 750:1, or greater than about 1000:1 or more in some cases.

In some embodiments, a nanoscale wire are substantially uniform, or have a variation in average diameter of the nanoscale wire of less than about 30%, less than about 25%, less than about 20%, less than about 15%, less than about 10%, or less than about 5%. For example, the nanoscale wires may be grown from substantially uniform nanoclusters or particles, e.g., colloid particles. See, e.g., U.S. Pat. No. 7,301,199, issued Nov. 27, 2007, entitled "Nanoscale Wires and Related Devices," by Lieber, et al., incorporated herein by reference in its entirety. In some cases, the nanoscale wire may be one of a population of nanoscale wires having an average variation in diameter, of the population of nanowires, of less than about 30%, less than about 25%, less than about 20%, less than about 15%, less than about 10%, or less than about 5%.

In some embodiments, a nanoscale wire has a conductivity of or of similar magnitude to any semiconductor or any metal. The nanoscale wire can be formed of suitable materials, e.g., semiconductors, metals, etc., as well as any suitable combinations thereof. In some cases, the nanoscale wire will have the ability to pass electrical charge, for example, being electrically conductive. For example, the nanoscale wire may have a relatively low resistivity, e.g., less than about $10^{-3}$ Ohm m, less than about $10^{-4}$ Ohm m, less than about $10^{-6}$ Ohm m, or less than about $10^{-7}$ Ohm m. The nanoscale wire can, in some embodiments, have a conductance of at least about 1 microsiemens, at least about 3 microsiemens, at least about 10 microsiemens, at least about 30 microsiemens, or at least about 100 microsiemens.

The nanoscale wire can be solid or hollow, in various embodiments. As used herein, a "nanotube" is a nanoscale wire that is hollow, or that has a hollowed-out core, including those nanotubes known to those of ordinary skill in the art. As another example, a nanotube may be created by creating a core/shell nanowire, then etching away at least a portion of the core to leave behind a hollow shell. Accordingly, in one set of embodiments, the nanoscale wire is a non-carbon nanotube. In contrast, a "nanowire" is a nanoscale wire that is typically solid (i.e., not hollow). Thus, in one set of embodiments, the nanoscale wire may be a semiconductor nanowire, such as a silicon nanowire.

In one set of embodiments, a nanoscale wire may comprise or consist essentially of a semiconductor. Typically, a semiconductor is an element having semiconductive or semi-metallic properties (i.e., between metallic and non-metallic properties). An example of a semiconductor is silicon. Other non-limiting examples include elemental semiconductors, such as gallium, germanium, diamond (carbon), tin, selenium, tellurium, boron, or phosphorous. In other embodiments, more than one element may be present in the nanoscale wire as the semiconductor, for example, gallium arsenide, gallium nitride, indium phosphide, cadmium selenide, etc. Still other examples include a Group II-VI material (which includes at least one member from Group II of the Periodic Table and at least one member from Group VI, for example, ZnS, ZnSe, ZnSSe, ZnCdS, CdS, or CdSe), or a Group III-V material (which includes at least one member from Group III and at least one member from Group V, for example GaAs, GaP, GaAsP, InAs, InP, AlGaAs, or InAsP).

In certain embodiments, the semiconductor can be undoped or doped (e.g., p-type or n-type). For example, in one set of embodiments, a nanoscale wire may be a p-type semiconductor nanoscale wire or an n-type semiconductor nanoscale wire, and can be used as a component of a transistor such as a field effect transistor ("FET"). For instance, the nanoscale wire may act as the "gate" of a source-gate-drain arrangement of a FET, while metal leads or other conductive pathways (as discussed herein) are used as the source and drain electrodes.

In some embodiments, a dopant or a semiconductor may include mixtures of Group IV elements, for example, a mixture of silicon and carbon, or a mixture of silicon and germanium. In other embodiments, the dopant or the semiconductor may include a mixture of a Group III and a Group V element, for example, BN, BP, BAs, AlN, AlP, AlAs, AlSb, GaN, GaP, GaAs, GaSb, InN, InP, InAs, or InSb. Mixtures of these may also be used, for example, a mixture of BN/BP/BAs, or BN/AlP. In other embodiments, the dopants may include alloys of Group III and Group V elements. For example, the alloys may include a mixture of AlGaN, GaPAs, InPAs, GaInN, AlGaInN, GaInAsP, or the like. In other embodiments, the dopants may also include a mixture of Group II and Group VI semiconductors. For example, the semiconductor may include ZnO, ZnS, ZnSe, ZnTe, CdS, CdSe, CdTe, HgS, HgSe, HgTe, BeS, BeSe, BeTe, MgS, MgSe, or the like. Alloys or mixtures of these dopants are also be possible, for example, (ZnCd)Se, or Zn(SSe), or the like. Additionally, alloys of different groups of semiconductors may also be possible, for example, a combination of a Group II-Group VI and a Group III-Group V semiconductor, for example, $(GaAs)_x(ZnS)_{1-x}$. Other examples of dopants may include combinations of Group IV and Group VI elements, such as GeS, GeSe, GeTe, SnS, SnSe, SnTe, PbO, PbS, PbSe, or PbTe. Other semiconductor mixtures may include a combination of a Group I and a Group VII, such as CuF, CuCl, CuBr, Cut AgF, AgCl, AgBr, AgI, or the like. Other dopant compounds may include different mixtures of these elements, such as $BeSiN_2$, $CaCN_2$, $ZnGeP_2$, $CdSnAs_2$, $ZnSnSb_2$, $CuGeP_3$, $CuSi_2P_3$, $Si_3N_4$, $Ge_3N_4$, $Al_2O_3$, $(Al, Ga, In)_2(S, Se, Te)_3$, $Al_2CO$, $(Cu, Ag)(Al, Ga, In, Tl, Fe)(S, Se, Te)_2$ and the like.

The doping of the semiconductor to produce a p-type or n-type semiconductor may be achieved via bulk-doping in certain embodiments, although in other embodiments, other doping techniques (such as ion implantation) can be used. Many such doping techniques that can be used will be familiar to those of ordinary skill in the art, including both bulk doping and surface doping techniques. A bulk-doped article (e.g. an article, or a section or region of an article) is an article for which a dopant is incorporated substantially throughout the crystalline lattice of the article, as opposed to an article in which a dopant is only incorporated in particular regions of the crystal lattice at the atomic scale, for example, only on the surface or exterior. For example, some articles are typically doped after the base material is grown, and thus the dopant only extends a finite distance from the surface or exterior into the interior of the crystalline lattice. It should be understood that "bulk-doped" does not define or reflect a concentration or amount of doping in a semiconductor, nor does it necessarily indicate that the doping is uniform. "Heavily doped" and "lightly doped" are terms the meanings of which are clearly understood by those of ordinary skill in the art. In some embodiments, one or more regions comprise a single monolayer of atoms ("delta-doping"). In certain cases, the region may be less than a single monolayer thick (for example, if some of the atoms within the monolayer are absent). As a specific example, the regions may be arranged in a layered structure within the nanoscale wire, and one or more of the regions can be delta-doped or partially delta-doped.

Accordingly, in one set of embodiments, the nanoscale wires may include a heterojunction, e.g., of two regions with dissimilar materials or elements, and/or the same materials or elements but at different ratios or concentrations. The regions of the nanoscale wire may be distinct from each other with minimal cross-contamination, or the composition of the nanoscale wire can vary gradually from one region to the next. The regions may be both longitudinally arranged relative to each other, or radially arranged (e.g., as in a core/shell arrangement) on the nanoscale wire. Each region may be of any size or shape within the wire. The junctions may be, for example, a p/n junction, a p/p junction, an n/n junction, a p/i junction (where i refers to an intrinsic semiconductor), an n/i junction, an i/i junction, or the like. The junction can also be a Schottky junction in some embodiments. The junction may also be, for example, a semiconductor/semiconductor junction, a semiconductor/metal junction, a semiconductor/insulator junction, a metal/metal junction, a metal/insulator junction, an insulator/insulator junction, or the like. The junction may also be a junction of two materials, a doped semiconductor to a doped or an undoped semiconductor, or a junction between regions having different dopant concentrations. The junction can also be a defected region to a perfect single crystal, an amorphous region to a crystal, a crystal to another crystal, an amorphous region to another amorphous region, a defected region to another defected region, an amorphous region to a defected region, or the like. More than two regions may be present, and these regions may have unique compositions or may comprise the same compositions. As one example, a wire can have a first region having a first composition, a second region having a second composition, and a third region having a third composition or the same composition as the first composition. Non-limiting examples of nanoscale wires comprising heterojunctions (including core/shell heterojunctions, longitudinal heterojunctions, etc., as well as combinations thereof) are discussed in U.S. Pat. No. 7,301,199, issued Nov. 27, 2007, entitled "Nanoscale Wires and Related Devices," by Lieber, et al., incorporated herein by reference in its entirety.

In some embodiments, the nanoscale wire is a bent or a kinked nanoscale wire. A kink is typically a relatively sharp transition or turning between a first substantially straight portion of a wire and a second substantially straight portion of a wire. For example, a nanoscale wire may have 1, 2, 3, 4, or 5 or more kinks. In some cases, the nanoscale wire is formed from a single crystal and/or comprises or consists essentially of a single crystallographic orientation, for example, a <110> crystallographic orientation, a <112> crystallographic orientation, or a <११$\bar{2}$0> crystallographic orientation. It should be noted that the kinked region need not have the same crystallographic orientation as the rest of the semiconductor nanoscale wire. In some embodiments, a kink in the semiconductor nanoscale wire may be at an angle of about 120° or a multiple thereof. The kinks can be intentionally positioned along the nanoscale wire in some cases. For example, a nanoscale wire may be grown from a catalyst particle by exposing the catalyst particle to various gaseous reactants to cause the formation of one or more kinks within the nanoscale wire. Non-limiting examples of kinked nanoscale wires, and suitable techniques for making such wires, are disclosed in International Patent Application No. PCT/US2010/050199, filed Sep. 24, 2010, entitled "Bent Nanowires and Related Probing of Species," by Tian, et al., published as WO 2011/038228 on Mar. 31, 2011, incorporated herein by reference in its entirety.

In some embodiments, the nanoscale wires used herein are individual or free-standing nanoscale wires. For example, an "individual" or a "free-standing" nanoscale wire may, at some point in its life, not be attached to another article, for example, with another nanoscale wire, or the free-standing nanoscale wire may be in solution. This is in contrast to nanoscale features etched onto the surface of a substrate, e.g., a silicon wafer, in which the nanoscale features are never removed from the surface of the substrate as a free-standing article. This is also in contrast to conductive portions of articles which differ from surrounding material only by having been altered chemically or physically, in situ, i.e., where a portion of a uniform article is made different from its surroundings by selective doping, etching, etc. An "individual" or a "free-standing" nanoscale wire is one that can be (but need not be) removed from the location where it is made, as an individual article, and transported to a different location and combined with different components to make a functional device such as those described herein and those that would be contemplated by those of ordinary skill in the art upon reading this disclosure.

The nanoscale wire, in some embodiments, may be responsive to a property external of the nanoscale wire, e.g., a chemical property, an electrical property, a physical property, etc. Such determination may be qualitative and/or quantitative, and such determinations may also be recorded, e.g., for later use. For example, in one set of embodiments, the nanoscale wire may be responsive to voltage. For instance, the nanoscale wire may exhibits a voltage sensitivity of at least about 5 microsiemens/V; by determining the conductivity of a nanoscale wire, the voltage surrounding the nanoscale wire may thus be determined. In other embodiments, the voltage sensitivity can be at least about 10 microsiemens/V, at least about 30 microsiemens/V, at least about 50 microsiemens/V, or at least about 100 microsiemens/V. Other examples of electrical properties that can be determined include resistance, resistivity, conductance, conductivity, impedance, or the like.

As another example, a nanoscale wire may be responsive to a chemical property of the environment surrounding the nanoscale wire. For example, an electrical property of the nanoscale wire can be affected by a chemical environment surrounding the nanoscale wire, and the electrical property can be thereby determined to determine the chemical environment surrounding the nanoscale wire. As a specific non-limiting example, the nanoscale wires may be sensitive to pH or hydrogen ions. Further non-limiting examples of such nanoscale wires are discussed in U.S. Pat. No. 7,129,554, filed Oct. 31, 2006, entitled "Nanosensors," by Lieber, et al., incorporated herein by reference in its entirety.

As a non-limiting example, the nanoscale wire may have the ability to bind to an analyte indicative of a chemical property of the environment surrounding the nanoscale wire (e.g., hydrogen ions for pH, or concentration for an analyte of interest), and/or the nanoscale wire may be partially or fully functionalized, i.e. comprising surface functional moieties, to which an analyte is able to bind, thereby causing a determinable property change to the nanoscale wire, e.g., a change to the resistivity or impedance of the nanoscale wire. The binding of the analyte can be specific or non-specific. Functional moieties may include simple groups, selected from the groups including, but not limited to, —OH, —CHO, —COOH, —SO₃H, —CN, —NH₂, —SH, —COSH, —COOR, halide; biomolecular entities including, but not limited to, amino acids, proteins, sugars, DNA, antibodies, antigens, and enzymes; grafted polymer chains with chain length less than the diameter of the nanowire core, selected from a group of polymers including, but not limited to, polyamide, polyester, polyimide, polyacrylic; a shell of material comprising, for example, metals, semiconductors, and insulators, which may be a metallic element, an oxide, an sulfide, a nitride, a selenide, a polymer and a polymer gel. A non-limiting example of a protein is PSA (prostate specific antigen), which can be determined, for example, by modifying the nanoscale wires by binding monoclonal antibodies for PSA (Abl) thereto. See, e.g., U.S. Pat. No. 8,232,584, issued Jul. 31, 2012, entitled "Nanoscale Sensors," by Lieber, et al., incorporated herein by reference in its entirety.

In some embodiments, a reaction entity may be bound to a surface of the nanoscale wire, and/or positioned in relation to the nanoscale wire such that the analyte can be determined by determining a change in a property of the nanoscale wire. The "determination" may be quantitative and/or qualitative, depending on the application, and in some cases, the determination may also be analyzed, recorded for later use, transmitted, or the like. The term "reaction entity" refers to any entity that can interact with an analyte in such a manner to cause a detectable change in a property (such as an electrical property) of a nanoscale wire. The reaction entity may enhance the interaction between the nanowire and the analyte, or generate a new chemical species that has a higher affinity to the nanowire, or to enrich the analyte around the nanowire. The reaction entity can comprise a binding partner to which the analyte binds. The reaction entity, when a binding partner, can comprise a specific binding partner of the analyte. For example, the reaction entity may be a nucleic acid, an antibody, a sugar, a carbohydrate or a protein. Alternatively, the reaction entity may be a polymer, catalyst, or a quantum dot. A reaction entity that is a catalyst can catalyze a reaction involving the analyte, resulting in a product that causes a detectable change in the nanowire, e.g. via binding to an auxiliary binding partner of the product electrically coupled to the nanowire. Another exemplary reaction entity is a reactant that reacts with the analyte, producing a product that can cause a detectable change in the nanowire. The reaction entity can comprise a shell on the nanowire, e.g. a shell of a polymer that recognizes molecules in, e.g., a gaseous sample, causing a change in conductivity of the polymer which, in turn, causes a detectable change in the nanowire.

Nanoscale wires such as those described herein may be used any in any of a variety of devices. Non-limiting examples of such devices include a switch; a diode; a Light-Emitting Diode; a tunnel diode; a Schottky diode; a Bipolar Junction Transistor; a Field Effect Transistor; an inverter; a complimentary inverter; an optical sensor; a sensor for an analyte (e.g., DNA); a memory device; a dynamic memory device; a static memory device; a laser; a logic gate; an AND gate; a NAND gate; an EXCLUSIVE-AND gate; an OR gate; a NOR gate; an EXCLUSIVE-OR gate; a latch; a register; clock circuitry; a logic array; a state machine; a programmable circuit; an amplifier; a transformer; a signal processor; a digital circuit; an analog circuit; a light emission source; a photoluminescent device; an electroluminescent device; a rectifier; a photodiode; a p-n solar cell; a phototransistor; a single-electron transistor; a single-photon emitter; a single-photon detector; a spintronic device; an ultra-sharp tip for atomic force microscope; a scanning tunneling microscope; a field-emission device; a photoluminescence tag; a photovoltaic device; a photonic band gap materials; a scanning near field optical microscope tips; and a circuit that has digital and analog components. For instance, in one set of embodiments, the device may be a photonic device, a solar cell, or a catalytic scaffold.

The following documents are incorporated herein by reference in their entireties: U.S. Pat. No. 7,211,464, issued May 1, 2007, entitled "Doped Elongated Semiconductors, Growing Such Semiconductors, Devices Including Such Semiconductors, and Fabricating Such Devices," by Lieber, et al.; U.S. Pat. No. 7,129,554, issued Oct. 31, 2006, entitled "Nanosensors," by Lieber, et al.; U.S. Pat. No. 7,301,199, issued Nov. 27, 2007, entitled "Nanoscale Wires and Related Devices," by Lieber, et al.; U.S. patent application Ser. No. 10/588,833, filed Aug. 9, 2006, entitled "Nanostructures Containing Metal-Semiconductor Compounds," by Lieber, et al., published as U.S. Patent Application Publication No. 2009/0004852 on Jan. 1, 2009; U.S. patent application Ser. No. 11/629,722, filed Dec. 15, 2006, entitled "Nanosensors," by Wang, et al., published as U.S. Patent Application Publication No. 2007-0264623 on Nov. 15, 2007; U.S. patent application Ser. No. 12/308,207, filed Dec. 9, 2008, entitled "Nanosensors and Related Technologies," by Lieber, et al.; U.S. Pat. No. 8,232,584, issued Jul. 31, 2012, entitled "Nanoscale Sensors," by Lieber, et al.; U.S. patent application Ser. No. 12/312,740, filed May 22, 2009, entitled "High-Sensitivity Nanoscale Wire Sensors," by Lieber, et al., published as U.S. Patent Application Publication No.

2010-0152057 on Jun. 17, 2010; and International Patent Application No. PCT/US2010/050199, filed Sep. 24, 2010, entitled "Bent Nanowires and Related Probing of Species," by Tian, et al., published as WO 2011/038228 on Mar. 31, 2011.

The following examples are intended to illustrate certain embodiments of the present invention, but do not exemplify the full scope of the invention.

Example 1

Advances in nanoscale devices are driven by synthesis of nanostructures with tailored morphology, crystal structure, and composition. Axially and radially modulated semiconductor nanowires are examples of nanostructures with one and two structural degrees of freedom, respectively, and are often used in transistor, photonic, piezoelectric, and thermoelectric nanodevices. Nevertheless, nanostructures with higher degrees of freedom (anisotropy) and devices investigating their potential have not been demonstrated. This example demonstrates gas-phase facet selective growth of Ge and Si on Si nanowire surfaces, although other materials may also be used in other embodiments. The selectively deposited Ge is crystalline and its facet position could be synthetically controlled in situ. This synthesis was used to prepare optoelectronic nanodevices with newly accessible anisotropies and embedded nanocavities. Devices with the selectively embedded nanocavities sustain unique photonic modes whose amplitude and wavelength could be significantly tuned as a function of cavity size. Furthermore, these cavities could be infiltrated with nanoscale species such as 5 nm Au nanoparticles.

Nanomaterials owe many of their unique physical properties to size, topology, and surface. Semiconductor nanowires (NWs) are a promising nanomaterial whose structural, electronic, and optical properties have been used in active nanodevices including high-performance field-effect transistors, ultra-sensitive biological probes, piezoelectric energy harvesters, and solar cells and photonic devices with tunable optical spectra. NWs can be classified according to the number of degrees of freedom (DoF) they possess, which represent fundamental physical coordinates along which their structure can be manipulated. Axially and radially modulated NWs have 1 and 2 DoF, respectively, and have been extensively studied and characterized. Nevertheless, the properties of nanostructures possessing greater complexity and anisotropy have not been determined.

Figure 1B:
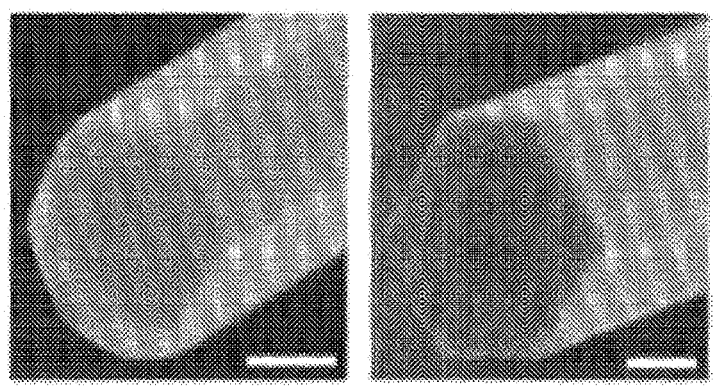
Figure 1C:
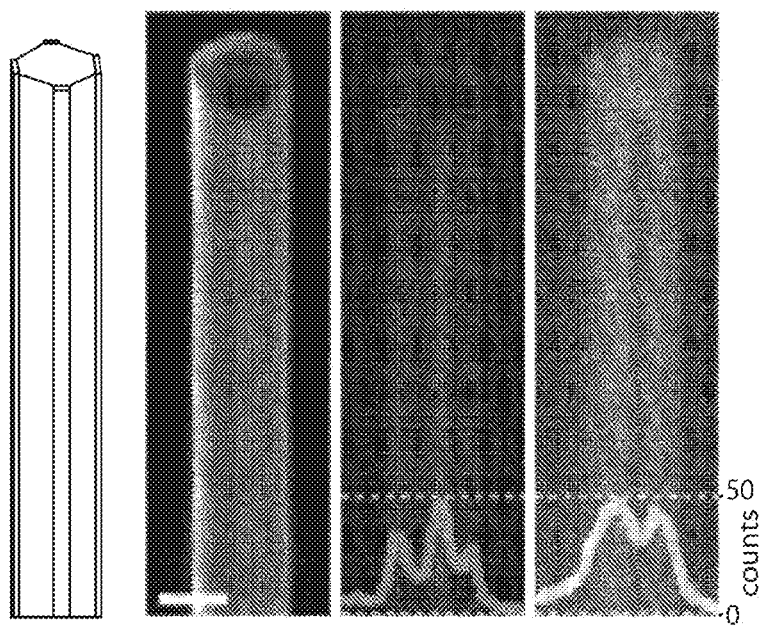
Figure 1D:
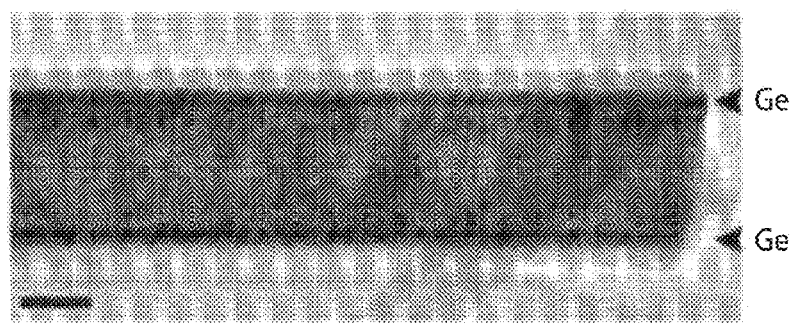

A nanostructure with 3, and higher, DoF can be realized by breaking the rotational symmetry of conventional radial shell growth (FIG. 1A). A high-resolution scanning electron micrograph (SEM) of a faceted core/shell Si NW (FIG. 1B) revealed well-defined surfaces which can be indexed as {111}, {011}, and {113}. This NW served as the faceted template from which all subsequent nanostructures in these examples were grown. Following chemical vapor deposition (CVD) synthesis of the Si template, introduction of $GeH_4$ and $H_2$ at lower temperature and pressure into the same reactor yielded a new product revealing selective material deposition on the {111} and {011} Si surface facets (FIG. 1B). Energy dispersive x-ray spectroscopy (EDS) performed on the nanostructure (FIG. 1C) confirmed the elemental identity of the deposited material as Ge and revealed that facet selectivity was preserved along the length of the nanostructure. A planview transmission electron micrograph (TEM) of the anisotropic Si—Ge nanostructure (FIG. 1D) revealed mesas with a uniform dark contrast corresponding to Ge. The Ge appeared smooth and ordered and extends uniformly along the length of the {011} facet to which it is bound. Notably, these results differ significantly from the disordered, island morphologies that typify Stranski-Krastanov growth of Ge on planar and nanoscale Si surfaces.

FIG. 1 shows facet selective growth of Ge on Si yields nanostructure with new DoF. FIG. 1A shows schematics depicting isotropic (top) versus anisotropic (bottom) growth of Ge on a faceted Si template. FIG. 1B shows an SEM of faceted Si template (left) and of nanostructure (right) after selective deposition of 10 nm of Ge (lighter contrast) on Si {111} and {011} surfaces. Images are oriented with {111} surfaces on top and bottom. Scale bars, 100 nm. FIG. 1C shows a schematic (far left) and SEM (center left) of a single nanostructure. Ge (center right) and Si (far right) EDS elemental maps of the same nanostructure and line profiles extracted from signal counts along the x-axis of the images. Images are oriented with {011} surface facing the reader. Scale bar, 200 nm. FIG. 1D is a bright-field planview TEM of nanostructure. Scale bar, 100 nm.

Syntheses were performed using different Si templates, temperatures, and gas-phase species to determine their role in growth of Si—Ge (heteroepitaxial) and Si—Si (homoepitaxial) nanostructures with distinct anisotropies. After performing each synthesis for 5 min (FIGS. 2A, 5 and 6), 40 nm thick cross-sections of the synthesized nanostructures were prepared and their morphology analyzed by bright-field TEM (FIGS. 2B, 5 and 6).

FIG. 2 shows tuning anisotropy with gas-phase synthesis. FIG. 2A shows schematics summarizing three syntheses conducted to explore control of facet selective growth of Ge (center) on a faceted Si template (outer). FIG. 2B shows bright-field TEMs of 40 nm thick cross-sections of nanostructures 1-3 prepared according to the syntheses outlined in FIG. 2A. Images are oriented with {111} surfaces on top and bottom. Scale bars, 50 nm.

Figure 5A:
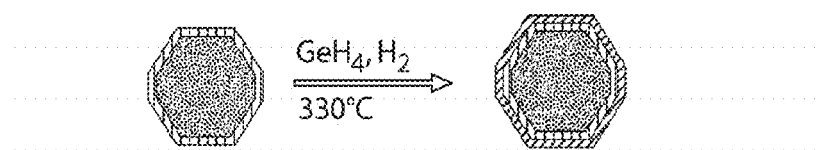
FIGS. 5A-5C illustrates growth on the surfaces of nanoscale wires, in certain embodiments of the invention.
Figures 5B, 5C:
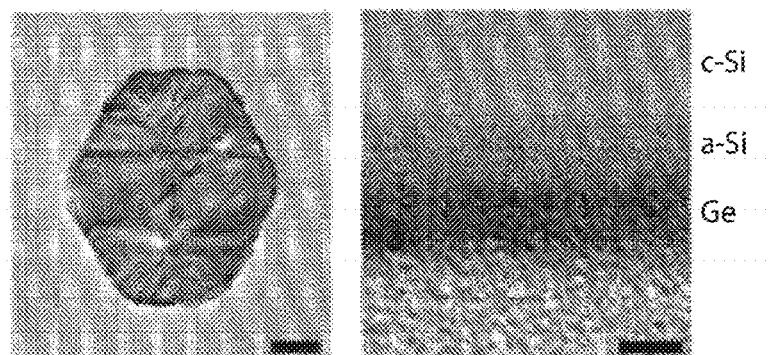

FIG. 5 shows the template surface during facet selective growth of Ge. FIG. 5A shows a schematic of synthesis conditions which are identical to those for Structure 1. The Si template (center) has been covered with an amorphous Si shell (outer). FIG. 5B is a bright-field TEM of a 40 nm thick cross-section of the nanostructure grown as outlined in FIG. 5A. The image is oriented with {111} surfaces on top and bottom. Scale bar, 50 nm. FIG. 5C is a high-resolution TEM near {111} surface identifying the intentionally deposited amorphous Si shell and a thin conformal Ge shell. Scale bar, 3 nm.

Figure 6A:
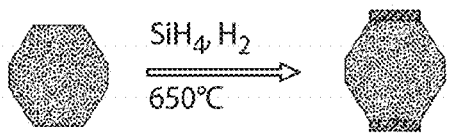
FIGS. 6A-6C illustrate homoepitaxial growth on a silicon nanowire, in another embodiment of the invention.
Figure 6B:
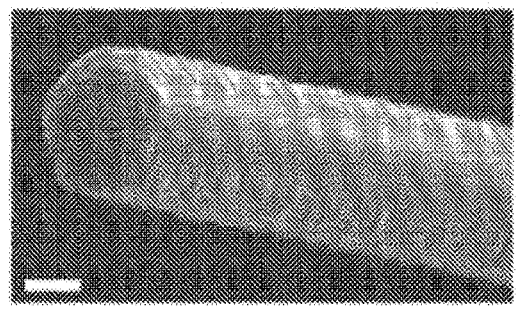
Figure 6C:
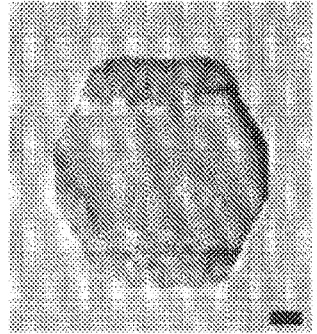

FIG. 6 shows facet selective Si homoepitaxial growth. FIG. 6A shows a schematic outlining synthesis conditions for facet-selective growth of Si on a Si template. FIG. 6B shows SEM of the nanostructure grown as outlined in FIG. 6A. The image is oriented with {111} surfaces on top and bottom. Scale bar, 200 nm. FIG. 6C shows a bright-field TEM of nanostructure cross-section with {111} surfaces oriented on top and bottom of image. Scale bar, 50 nm. Facet-selective Si deposition is visible on the {111} surfaces. By comparing the dimensions and facet lengths of the nanostructure against these same values for the template it was confirmed that no Si grew on the {113} and {011} surfaces.

TEM analysis of a nanostructure synthesized at 330° C. with $GeH_4$ and $H_2$ revealed dark contrasts corresponding to Ge that has selectively grown on the {111} and {011} surfaces of the template (FIG. 2: Structure 1). No dark contrast was visible on the {113} Si surfaces, thus reinforcing the previous statement regarding the high selectivity for this Ge growth (FIG. 1). From TEM measurements and Ge growth time, the growth rates of Ge on {011} and {111} surfaces were estimated to be 2 nm/min and 1 nm/min, respectively. Repeating this synthesis in the presence of the faceted Si template coated with a 3 nm thick amorphous Si layer yielded a thin isotropic Ge shell (FIG. 5). Interestingly, growth at 650° C. with $SiH_4$ and $H_2$ lead to selective Si growth on the {111} surfaces of the Si template (FIG. 6). This result contrasts with the isotropic nanocrystalline Si shell observed when this synthesis is performed on an axial Si NW without well-defined surface facets. Together, these results demonstrate that the surface properties of the template play an important role in controlling facet selective growth.

To determine whether Ge can be selectively grown on other facets, syntheses at higher temperature and with various gas-phase precursors were examined. TEM analysis of a nanostructure synthesized at 380° C. with $GeH_4$, $PH_3$, and Ar revealed (FIG. 2: Structure 2) estimated Ge growth rates on the {113}, {011}, and {111} surfaces of 3.0, 1.6, and 0.3 nm/min, respectively. In Structure 2, the 10 times faster growth rate of Ge on {113} versus {111} was a striking reversal of the observed growth trend on these surfaces for Structure 1. It was determined that Ar alone enhanced growth of Ge on {113} versus {111} while $PH_3$ improved selectivity by suppressing Ge growth on the {111} surface, likely through passivation of Si surface sites with adsorbed phosphine or phosphine-derived species. Finally, TEM analysis of a nanostructure synthesized at 380° C. with $GeH_4$ and no other gas-phase species revealed (FIG. 2: Structure 3) an isotropic Ge shell and an estimated growth rate for this shell of 10 nm/min. This result confirmed the importance of gas-phase species in mediating facet selective growth of Ge at higher temperatures. In summary, these results demonstrate the first gas-phase facet selective growth of Ge and Si on Si nanowire surfaces and show that their facet position can be synthetically controlled in situ to elaborate unique nanostructures with higher anisotropy.

Example 2

Figure 3A:
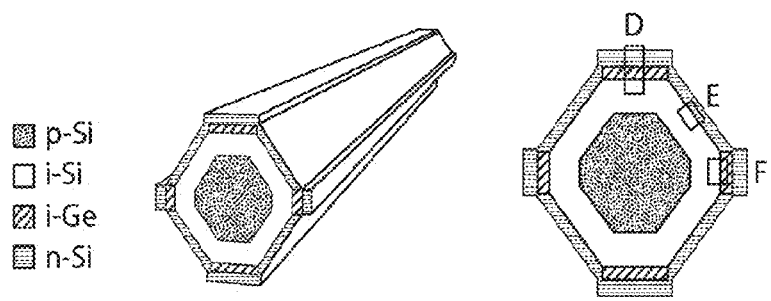
FIGS. 3A-3F illustrate nanoscale wires containing germanium, in accordance with yet another set of embodiments.
Figure 3B:
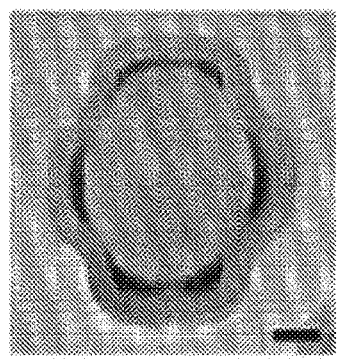
Figure 3C:
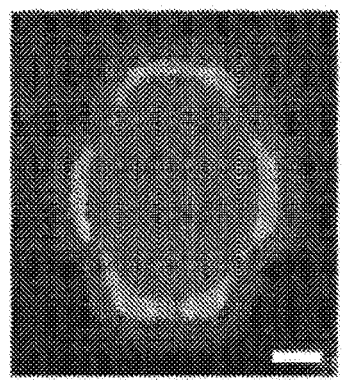

To explore more complex and optoelectronically active nanostructures, nanoscale Ge regions were synthesized then encapsulated within a Si p-n interface in this example. The proposed architecture included a faceted template with p-type and intrinsic Si shells, facet selectively grown Ge, and finally a conformal shell of n-type Si (FIG. 3A). Notably, despite the complexity of this nanostructure, all synthesis steps were carried out in a continuous sequence in a single reactor. Bright-field TEM (FIG. 3B) and EDS (FIG. 3C, FIG. 7) elemental mapping of the nanostructure cross-section verified that Ge was selectively embedded within the nanostructure while preserving its radially disposed Si p-n junction. High-resolution TEM analysis of a region of the cross-section near the Si {111} interface (FIG. 3D) revealed several important features. First, crystal lattice fringes proceed through the intrinsic Si/Ge/n-type Si region of interest and terminated at the amorphous $SiO_x$ layer passivating the nanostructure. Second, two-dimensional Fourier Transforms (FIG. 3D) of lattice resolved TEMs from the intrinsic Si and Ge regions showing well resolved spots consistent with the [112] zone-axis of the cubic crystal lattice. Third, the sharp contrast changes visible in bright-field (FIG. 3D) and dark-field TEM (FIG. 7 inset) depict the abrupt interfaces formed between Si and Ge. In addition, high resolution TEM of a region of the cross-section near the Si {113} interface (FIG. 3E) revealed an apparently clean intrinsic Si/n-type Si interface. Together, these results verified that the selectively deposited Ge and conformally grown n-type Si are crystal-line and that clean and sharp interfaces could be designed in these complex nanostructures.

Figure 3D:
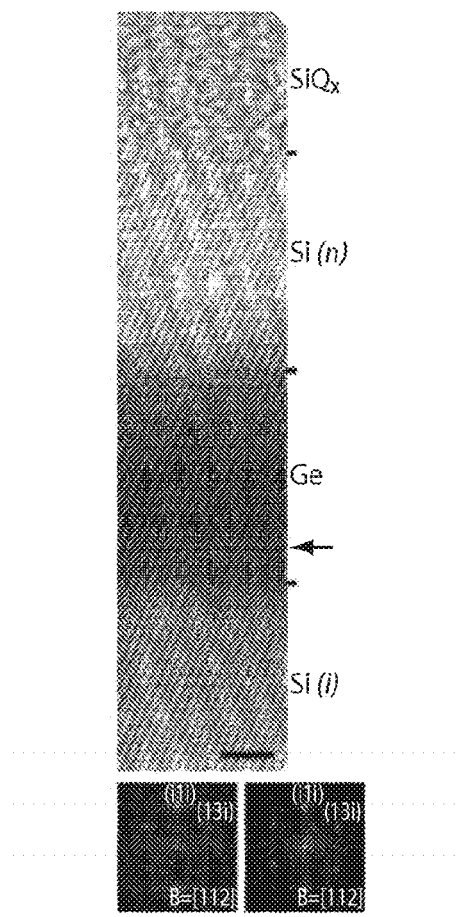
Figure 3E:
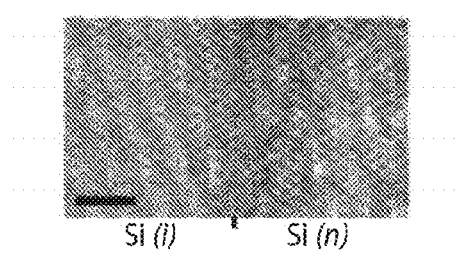
Figure 3F:
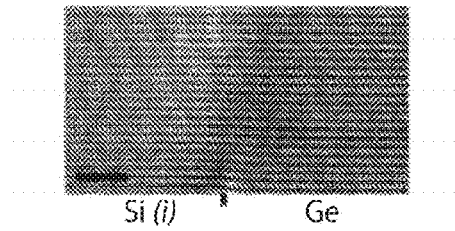

Furthermore, high-resolution TEM analysis of a region of the cross-section near the Si {011} interface (FIG. 3F and FIG. 8) revealed several features. First, Si {111} lattice fringes progressed across the intrinsic Si/Ge junction and were distorted near the edge of the Ge mesa where the Si {011} and {113} surfaces meet (FIG. 3F). Second, a TEM spanning the full width of this region (FIG. 8) showed a region of crystalline Ge that was 15 nm wide. Growth of planar Ge films on Si typically proceeds by the Stranski-Krastanov mechanism: an initial stage of epitaxial growth for thicknesses <5 nm is followed by a disordered, three-dimensional (island) phase as strain energy increases due to the 4.2% lattice mismatch. Notably, these results demonstrate epitaxial Ge growth over greater thicknesses and suggest this is due to homogeneous relaxation of compressive strain in the {011} plane, facilitated by the absence of crowding species on the adjacent {113} surface. Likewise, epitaxial growth of Ge persisted for growth in the <111> direction and showed evidence of formation of misfit dislocations ~4 epilayers away from the intrinsic Si/Ge interface (FIG. 3D).

FIG. 3 shows active nanostructure with selectively embedded Ge regions. FIG. 3A is a schematic (left) depicting a complex nanostructure with Ge regions selectively embedded within a p-i-n junction. Schematic (right) of the nanostructure cross-section with labels D, E, F corresponding to the figure panels where these interfaces are presented in detail (corresponding to FIGS. 3D, 3E, and 3F). FIG. 3B is a bright-field TEM of a 40 nm thick cross-section of the active nanostructure. The image is oriented with {111} surfaces on top and bottom. Scale bar, 50 nm. FIG. 3C is an EDS elemental map of section shown in (B) revealing Ge (light) embedded in Si (dark). Scale bar, 50 nm. FIG. 3D is a high-resolution TEM of the intrinsic Si/Ge/n-type Si region near the {111} interface within the nanostructure. The {111} plane lies parallel to the x-axis of the image. Two-dimensional FFTs of lattice-resolved TEMs of intrinsic Si (left) and Ge (right) regions. The cross-section is perpendicular to the nanostructure [112] zone axis. Arrow indicates site of misfit dislocation. Scale bar, 2 nm. FIG. 3E is a high-resolution TEM of the intrinsic Si/n-type Si region near the {113} interface within the nanostructure. The {113} plane lies parallel to the y-axis of the image. Scale bar, 2 nm. FIG. 3F is a high-resolution TEM of the intrinsic Si/Ge region near the {011} interface within the nanostructure. The {011} plane lies parallel to the y-axis of the image. Scale bar, 2 nm.

Figure 7:
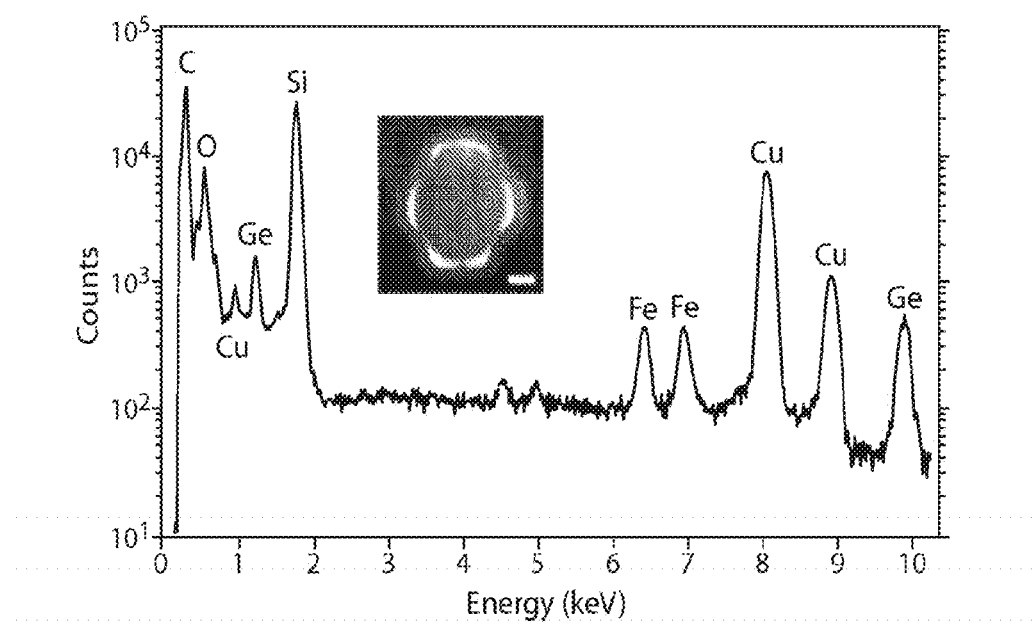
FIG. 7 illustrates an EDS spectrum of a nanoscale wire in another embodiment of the invention.

FIG. 7 shows an EDS spectrum of nanostructure with embedded Ge regions. EDS spectrum of a 40 nm thick cross-section (inset) of the nanostructure with Ge embedded within Si p-n junction. Ge L-beta (1.21 keV), Ge K-alpha) (9.88 keV), and Si K-alpha (1.76 keV) lines are discernable. Inset: dark-field TEM of the cross-section used to acquire the EDS spectrum. Scale bar, 50 nm.

Figure 8:
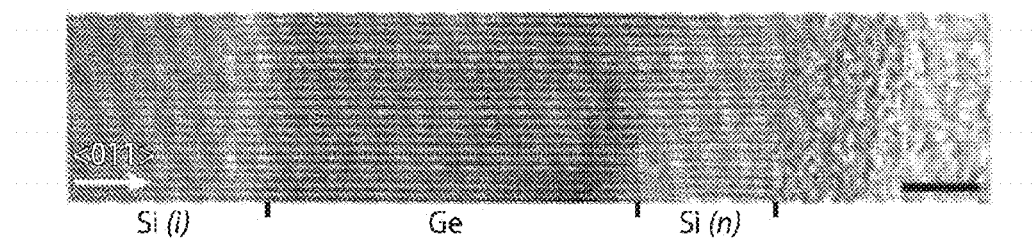
FIG. 8 is a TEM image of a silicon/germanium/silicon interface of a nanoscale wire, in yet another embodiment of the invention.

FIG. 8 is a TEM of Si/Ge/Si interface near {011}. High-resolution TEM of the intrinsic Si/Ge/n-Si region near the {011} interface within the nanostructure. The {011} plane lies parallel to the y-axis of the image. Scale bar, 3 nm.

Example 3

As a first step towards examining the optoelectronic properties of nanostructures with newly accessible anisotropies, a nanostructure with functional nanocavities was prepared in this example. Hydrogen peroxide was used to selectively etch Ge and thus convert the nanostructure synthesized in FIG. 3 to one with nanocavities embedded within the p-n junction (FIG. 4A). SEM and TEM analysis (FIG. 4B) verified that well-defined nanoscale cavities were etched in place of Ge and that they extend uniformly along the length of the nanostructure, where longitudinal etch distance was a function of the $H_2O_2$ etch time. Next, single nanodevices were fabricated with either a 10 or 20 nm wide nanocavity. Experimental and simulated external quantum efficiency (EQE) spectra (FIG. 9) obtained for the single nanodevices highlighted several new features. First, an absorption centered at 500 nm (FIG. 9A: peak 1) increased in amplitude as nanocavity size is enlarged from 10 to 20 nm. This enhanced absorption was well reproduced by simulation (FIG. 9B: peak 1) and attributed to an increase in optical feedback (FIG. 9C) due to change of refractive index within the porous nanostructure.

Figure 9A:
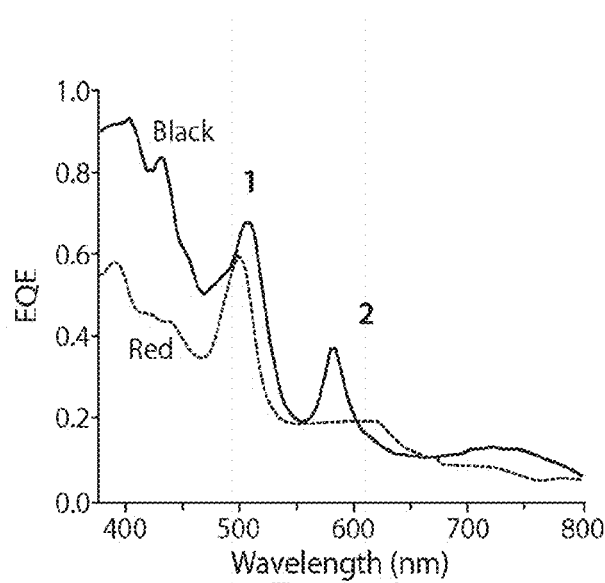
FIGS. 9A-9C illustrate EQE spectra of various nanoscale wire devices, in certain other embodiments of the invention.
Figure 9B:
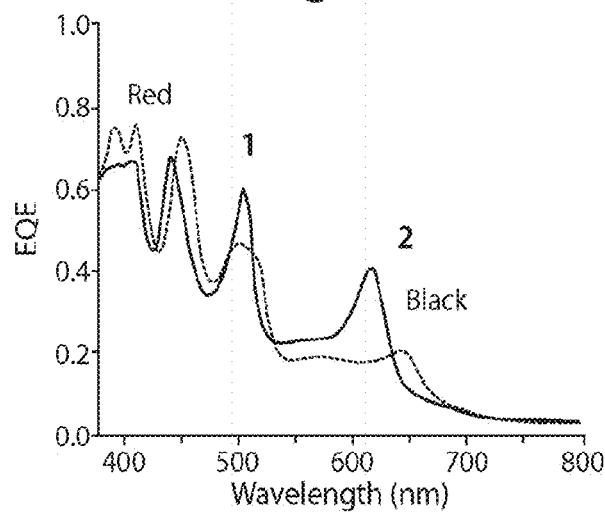

Second, a very weak absorption at 625 nm blue shifts by 40 nm and its amplitude increases by a factor of 2.0 as nanocavity size increased by 10 nm (FIG. 9A: peak 2). Simulation showed reasonable agreement with this trend, predicting a 30 nm blue shift and 2-fold increase in amplitude for the same nanocavity size change (FIG. 9B: peak 2). Analysis of simulated absorption mode profiles ascribed the wavelength shift to a pulling of the associated resonant mode (FIG. 9C) towards the lower refractive index air-filled nanocavity. Notably, it appears that the spectral properties of these nanostructures could be significantly altered through subtle modification of the size and position of the internal nanocavities.

Finally, the potential to deliver nanoscale species into the active nanoporous structure was examined. Immersion of the nanoporous structure in a 5 nm Au colloid solution could be a general method to infiltrate nanoparticles into the nanocavities (FIG. 4C). A planview TEM of the nanostructure following immersion shows 4 Au nanoparticles trapped within a nanocavity (FIG. 4C), which was encapsulated by intrinsic and n-type Si.

Figure 4B:
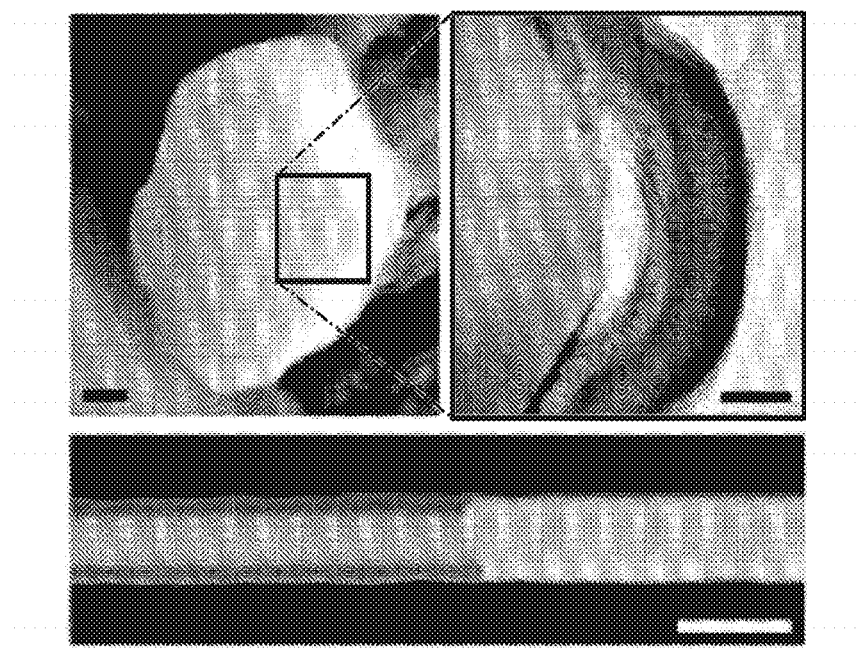
Figure 4C:
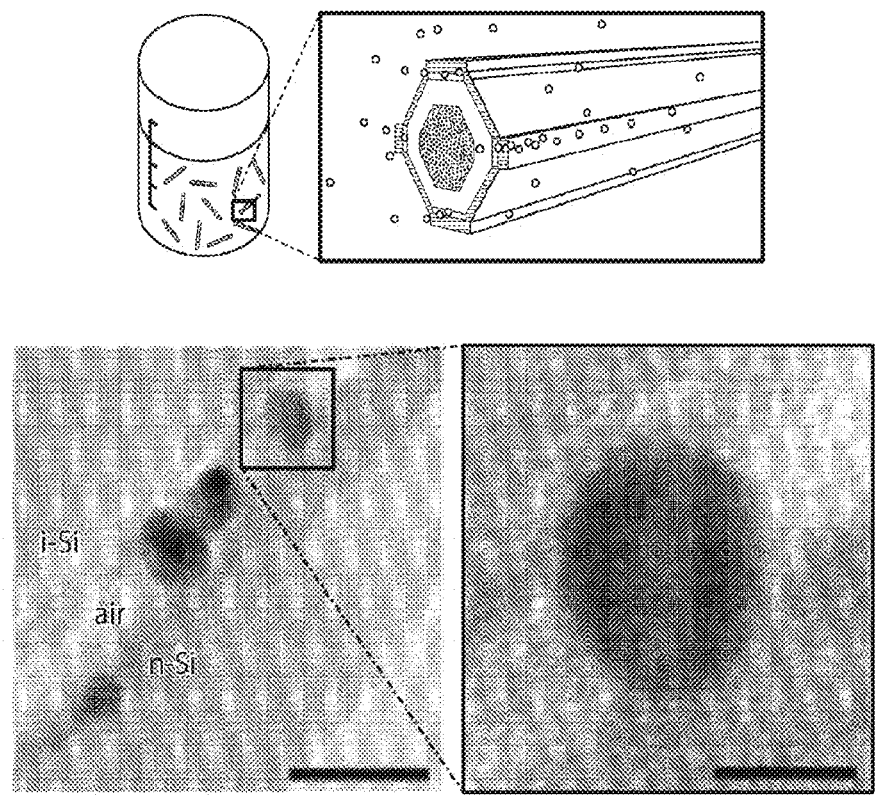

FIG. 4 shows the nanostructure with embedded nanocavities and delivery of Au nanoparticles. FIG. 4A shows a schematic demonstrating selective etching of Ge in $H_2O_2$ to form nanocavities. FIG. 4B shows an SEM (left, scale bar, 50 nm) of the end of an etched nanostructure; high-resolution TEM (right, scale bar, 20 nm) of a cross-section near the {011} interface; and a planview SEM (bottom, scale bar, 500 nm) of an etched nanostructure. FIG. 4C shows a schematic showing immersion of etched nanostructure in Au colloid solution. FIG. 4C also shows a TEM image (left, scale bar, 20 nm) showing 4 Au nanoparticles infiltrated into the nanostructure cavity, and a high-resolution TEM image (right, scale bar, 5 nm) showing magnified view of a 7 nm Au nanoparticle.

Figure 9C:
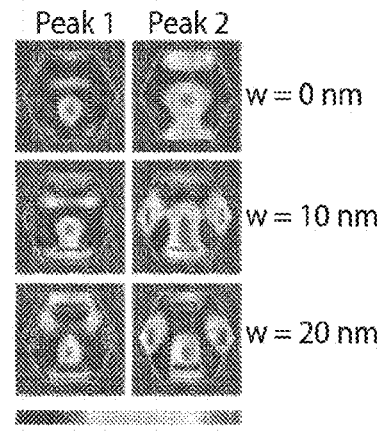

FIG. 9 shows an EQE spectra of nanostructure devices containing nanocavities. FIGS. 9A and 9B respectively show experimental and simulated absolute EQE spectra for the transverse-magnetic (TM) electric field polarization. Red and black lines correspond to nanostructures with 10 and 20 nm wide nanocavities, respectively. FDTD simulates nanostructures with hexagonal cross-sections, 230 nm diameters, and 10 and 20 nm wide cavities positioned 20 nm away from the outer Si surface of the nanostructure. SEM analyses of the devices used to obtain data in FIG. 9A show they have diameters of 224 and 236 nm. These values are within 2.6% of the simulated diameter. FIG. 9C shows simulated absorption mode profiles for peak 1 (505 nm) and peak 2 (685, 645, and 615 nm) for cavity sizes of 0, 10, and 20 nm.

Example 4

This example describes, in additional detail, certain procedures used in the above examples.

The following paragraphs describe various nanostructure syntheses.

A) Si Template: Au catalysts (100 nm diameter) were dispersed on poly-L-lysine functionalized 600 nm $SiO_2$-on-Si wafers. Substrates were inserted into a custom-built quartz-tube reactor and the system was evacuated to 2.8 mTorr base pressure. Crystalline intrinsic Si cores were grown at 460° C. and 40 Torr for 1 hour with flow rates of 1 and 60 standard cubic centimeters per minute (sccm) for silane ($SiH_4$), and hydrogen ($H_2$, Semiconductor Grade), respectively. A crystalline intrinsic Si shell was grown over these cores at 775° C. and 25 Torr for 30 min with flow rates of 0.15 and 60 sccm for silane and hydrogen, respectively. A calibrated shell growth rate of 1.7 nm/min was determined from independent studies of shell thickness vs. growth time.

B) Structure 1: Immediately following synthesis of the Si template, the reactor was purged to base pressure and re-pressurized to 4 Torr with a hydrogen flow rate of 20 sccm. This step was completed within 10 s. While pressurized, the reactor was cooled from 775° C. to 200° C. over 15 min. Facet selective synthesis of Ge was carried out at 330° C. and 5.8 Torr for 5 min with flow rates of 10 and 20 sccm for germane ($GeH_4$, 10% in $H_2$) and hydrogen, respectively.

C) Structure 2: Immediately following synthesis of the Si template, the reactor was purged to base pressure and argon (Ar, Semiconductor Grade) introduced at a flow rate of 20 sccm. With argon continuously flowing, the reactor was cooled from 775° C. to 300° C. over 5 min. Facet selective synthesis of Ge was carried out at 380° C. and 10 Torr for 5 min with flow rates of 10, 10, and 20 sccm for germane, phosphine ($PH_3$, 1000 p.p.m. in $H_2$) and argon, respectively.

D) Structure 3: Immediately following synthesis of the Si template, the reactor was purged to base pressure and cooled under vacuum from 775° C. to 300° C. over 5 min. Synthesis of a conformal Ge shell was carried out at 380° C. and 4 Torr for 5 min with a flow rate of 5 sccm for germane.

E) Structure in FIG. 3: Crystalline p-type Si cores were grown at 460° C. and 40 Torr for 1 hour with flow rates of 1, 5 and 60 sccm for silane, diborane (100 p.p.m. in $H_2$) and hydrogen, respectively. A crystalline p-type Si shell was grown over these cores at 775° C. and 25 Torr for 5 min with flow rates of 0.15, 1.5 and 60 sccm for silane, diborane and hydrogen, respectively. Next a crystalline intrinsic Si shell was grown over these cores at 775° C. and 25 Torr for 15 min with flow rates of 0.15 and 60 sccm for silane and hydrogen, respectively. Immediately following this synthesis, the reactor was purged to base pressure and re-pressurized to 4 Torr with a hydrogen flow rate of 20 sccm. While pressurized, the reactor was cooled from 775° C. to 200° C. over 15 min. Facet selective synthesis of Ge was carried out at 330° C. and 5.8 Torr for 7 min with flow rates of 10 and 20 sccm for germane and hydrogen, respectively. Next, the reactor was heated under vacuum to 550° C. and held at this temperature for 1 min. Synthesis of a conformal shell of n-type Si was carried out at 550° C. and 5 Torr for 1.5 min with flow rates of 2 and 10 sccm for silane and phosphine.

F) Structure in FIG. 5: Immediately following synthesis of the Si template, the reactor was purged to base pressure and cooled under vacuum from 775° C. to 400° C. over 4 min. Synthesis of a conformal amorphous Si layer was carried out at 450° C. and 5 Torr for 1 min with a flow rate of 2 sccm for silane. Next, the reactor was purged to base pressurze, re-pressurized to 4 Torr with a hydrogen flow rate of 20 sccm, and cooled over 2 min to 200° C. Subsequent synthesis conditions were as for Structure 1.

G) Structure in FIG. 6: Immediately following synthesis of the Si template, the reactor was purged to base pressure and hydrogen introduced at a flow rate of 60 sccm. With hydrogen continuously flowing, the reactor was cooled from 775° C. to 650° C. over 10 min. Facet selective synthesis of Si was carried out at 650° C. and 25 Torr for 20 min with flow rates of 0.15 and 60 sccm for silane and hydrogen, respectively.

TEM and EDS sample preparation and characterization was performed as follows. Cross-sections for TEM studies were prepared by embedding nanostructures in epoxy (Epo-Tek 353ND, Epoxy Technology). Samples were degassed to remove air bubbles and cured for 12 hours at 30° C. in a vacuum oven. A diamond knife (Ultra 35°, DiATOME) was used with a sectioning tool (Ultra Microtome, Leica) to cut ~40-60 nm thick sections from the cured epoxy slugs. The samples were transferred to lacey carbon grids for TEM analysis (JEOL 2100, JEOL Ltd.). An aberration corrected scanning TEM (cs-STEM, Libra 200 MC, Carl Zeiss NTS) equipped with twin EDS detectors and drift correction was used for acquisition of the EDS elemental map and spectrum shown in FIGS. 3C and 7. These EDS data were acquired at 1024×800 resolution over 1 hr using a 400 ms pixel dwell time and 1.2 nm spot size with beam energy of 200 kV. An SEM (Supra 55VP, Carl Zeiss NTS) equipped with EDS detector was used for acquisition of the EDS elemental maps shown in FIG. 1C. These EDS data were acquired at 512×400 resolution over 20 min using a 500 µs pixel dwell time with beam energy of 4 kV.

Nanostructure device fabrication. Nanostructures were synthesized with 10 and 20 nm wide embedded Ge regions (see paragraph E, above) and then covered with a 30 nm conformal layer of $SiO_2$ using plasma enhanced chemical vapor deposition (PECVD). These nanostructures were shear transferred from their growth substrates to $Si_3N_4$. SU-8 2000.5 was spin-coated to a thickness of 500 nm over the device substrate, pre-baked (95° C.), and electron beam lithography (EBL) was used to define SU-8 etch masks over a portion of the nanostructure. SU-8 was developed and cured for 10 min at 180° C. Subsequently, etching to the p-type Si core was accomplished in the following order: 5 s in BHF (for removal of the outer $SiO_2$ shell), 10 s in potassium hydroxide (KOH 38 vol. % in water) at 60° C., 10 s in hydrogen peroxide (30 vol. % in water) at 60° C., and 12 s in potassium hydroxide at 60° C. To selectively etch Ge from the nanostructure, the device substrate was immersed in hydrogen peroxide at 60° C. for 30 min. Last, EBL followed by thermal evaporation of 4 nm of Ti and 300 nm of Pd was performed to define ohmic contacts to the etched (p-type) core and un-etched (n-type) shell.

Device EQE spectra. Polarization-resolved photocurrent spectra were obtained on a custom-built optical setup utilizing a standard solar simulator (150 W, Newport Oriel) with AM 1.5 G filter as illumination source, a spectrometer (SpectraPro 300i, Acton Research) with 1200 g/mm grating and blaze angle of 500 nm, and an uncoated Glan-Thompson calcite polarizer (10GT04, Newport). Illumination power was measured using a power meter and low-power Si photodetector (1918-C and 918D-UV-0D3, Newport). Power spectra were acquired from 300 to 900 nm in 5 nm increments through 1.0, 1.3, and 2.0 mm diameter circular apertures to verify uniformity and accuracy of the power density used to calculate absolute EQE values. Nanostructure device photocurrents for transverse-electric (TE) and transverse-magnetic (TM) polarizations were measured from 300 to 900 nm in 5 nm increments using a semiconductor parameter analyzer (4156C, Agilent Technologies). Absolute EQE spectra were calculated using the wavelength-dependent photocurrent data collected as described above and the projected area of the nanostructures, which was measured by SEM. The projected area of the nanostructure was taken to be the exposed area of the unetched nanostructure when viewed perpendicular to the substrate plane and did not include the area covered by the 300 nm thick metal contacts.

FDTD calculations. The absorption cross section of the simulated nanostructures under illumination by a normally incident plane wave was obtained by integrating J. E at each grid point, where J and E are the polarization current density and electric field, respectively. The absorption cross section was integrated over one optical period, and the wavelength of incident light was scanned from 280 to 1000 nm in 5 nm increments. The absorption efficiency is the ratio of the nanostructure absorption cross section to its physical cross section. Last, EQE is calculated by multiplying the absorption efficiency by internal quantum efficiency (IQE), where IQE was assumed to be unity. The nanostructure was simulated as a volume element with hexagonal cross-section and a spatial resolution of $5/\sqrt{3}$, 5, and 5 nm for x, y and z, respectively, where y lies along the nanostructure axis and z lies along the propagation direction of the incident plane wave. The simulated nanostructures had diameters of 230 nm, with 0, 10, or 20 nm wide air-filled cavities positioned 20 nm from the Si surface. All simulations included the $Si_3N_4$ device substrate and conformal $SiO_2$ layer used in the experiment. Periodic boundary conditions were applied along the axis of the nanostructure. To ensure that a single nanostructure experiences an infinite plane wave, we implemented the total-field scattered-field (TFSF) method. Without this method, a single nanostructure would be simulated as a periodic array of nanostructures along the x-axis. The measured refractive index and extinction coefficient of single crystal silicon over the wavelength range, 280 to 1000 nm, was incorporated into the FDTD simulation.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A composition, comprising:
a crystalline nanoscale wire comprising a core and at least two separate shell regions surrounding portions of the core, wherein the core is faceted and comprises a facet selected from the group consisting of a {011} facet, a {111} facet and a {113} facet.

2. A composition, comprising:
a crystalline nanoscale wire comprising a core and at least two separate shell regions surrounding portions of the core, wherein the core is faceted, and wherein the at least two separate shell regions are each positioned substantially on a first facet but not a second facet of the core.

3. The composition of claim 1, wherein the facet is a {011} facet, and at least one of the shell regions is positioned on the {011} facet of the nanoscale wire.

4. The composition of claim 1, wherein the facet is a {111} facet, and at least one of the shell regions is positioned on the {111} facet of the nanoscale wire.

5. The composition of claim 1, wherein the facet is a {113} facet, and at least one of the shell regions is positioned on the {113} facet of the nanoscale wire.

6. The composition of claim 2, wherein the at least two separate shell regions are constructed and arranged to define one or more regions on the core of the crystalline nanoscale wire that contain a species.

7. A composition, comprising:
a crystalline nanoscale wire comprising a core and at least two separate shell regions surrounding portions of the core, wherein the composition of the core and the composition of at least one of the two separate shell regions are substantially identical.

8. The composition of claim 2, wherein the crystalline nanoscale wire comprises a semiconductor.

9. The composition of claim 2, wherein the core comprises Si.

10. The composition of claim 2, wherein the core consists essentially of Si.

11. The composition of claim 2, wherein at least one of the two separate shell regions comprises Si.

12. The composition of claim 2, wherein at least one of the two separate shell regions consists essentially of Si.

13. The composition of claim 1, wherein at least one of the two separate shell regions comprises Ge.

14. The composition of claim 1, wherein at least one of the two separate shell regions consists essentially of Ge.

15. The composition of claim 2, wherein the core has a diameter of less than about 1 micrometer.

16. The composition of claim 2, wherein the core has a variation in average diameter of less than about 20%.

* * * * *